United States Patent
Toyota et al.

(10) Patent No.: US 10,178,758 B2
(45) Date of Patent: Jan. 8, 2019

(54) PRINTED WIRING BOARD AND METHOD OF PRODUCING THE SAME

(71) Applicants: National University Corporation Okayama University, Okayama-shi, Okayama (JP); KYOCERA Circuit Solutions, Inc., Kyoto (JP)

(72) Inventors: Yoshitaka Toyota, Okayama (JP); Kengo Iokibe, Okayama (JP); Yuki Yamashita, Okayama (JP); Toshiyuki Kaneko, Hachioji (JP); Masanori Naito, Fuchu (JP); Kiyohiko Kaiya, Yokohama (JP); Toshihisa Uehara, Zama (JP); Koichi Kondo, Sendai (JP)

(73) Assignees: NATIONAL UNIVERSITY CORPORATION OKAYAMA UNIVERSITY, Kyoto (JP); KYOCERA CORPORATION, Kyoto-shi, Kyoto (JP)

( * ) Notice: Subject to any disclaimer, the term of this patent is extended or adjusted under 35 U.S.C. 154(b) by 153 days.

(21) Appl. No.: 14/951,606

(22) Filed: Nov. 25, 2015

(65) Prior Publication Data
US 2016/0157338 A1   Jun. 2, 2016

(30) Foreign Application Priority Data

Nov. 28, 2014 (JP) .................. 2014-242125
Feb. 27, 2015 (JP) .................. 2015-039026

(51) Int. Cl.
*H05K 1/02* (2006.01)

(52) U.S. Cl.
CPC ......... *H05K 1/0236* (2013.01); *H05K 1/0262* (2013.01); *H05K 2201/083* (2013.01)

(58) Field of Classification Search
CPC ............... H05K 1/0236; H05K 1/0262; H05K 2201/083
See application file for complete search history.

(56) References Cited

U.S. PATENT DOCUMENTS

2003/0021097 A1* 1/2003 Kikuchi ............... H05K 1/0218
                                                                361/818
2003/0080836 A1   5/2003 Nagaishi et al.
(Continued)

FOREIGN PATENT DOCUMENTS

JP  2003-133801 A  5/2003
JP  2008-010859 A  1/2008
(Continued)

OTHER PUBLICATIONS

Toyota, Y., et al., "A Study of Planar EBG Structure with Ferrite Thin Film for Practical Use," Okiyama University, Journal of 28th Spring Meeting, Japan Institute of Electronics Packaging, Mar. 5, 2014, 5 pgs.

*Primary Examiner* — Yuriy Semenenko
(74) *Attorney, Agent, or Firm* — Volpe and Koenig, P.C.

(57) ABSTRACT

A printed wiring board includes a digital circuit, an analog circuit, and a power supply path that is disposed on an insulating layer between the digital circuit and the analog circuit. A plurality of open stub EBG structures are disposed at an end of a bridge section in a power supply plane. The open stub EBG structure is an open stub state whose one end is connected to the power supply path and other end is in an open state.

13 Claims, 7 Drawing Sheets

(56) References Cited

U.S. PATENT DOCUMENTS

| | | | |
|---|---|---|---|
| 2006/0092093 A1* | 5/2006 | Choi | H01Q 15/006 343/909 |
| 2007/0090398 A1* | 4/2007 | McKinzie, III | H01P 1/20 257/192 |
| 2008/0158840 A1 | 7/2008 | Chen et al. | |
| 2010/0053013 A1 | 3/2010 | Konishi et al. | |
| 2010/0103639 A1* | 4/2010 | Pulugurtha | H05K 9/0083 361/818 |
| 2010/0214178 A1* | 8/2010 | Toyao | H01P 1/2005 343/702 |
| 2010/0265159 A1 | 10/2010 | Ando et al. | |
| 2011/0163823 A1* | 7/2011 | Park | H05K 1/0236 333/12 |
| 2013/0265736 A1* | 10/2013 | Rokuhara | H05K 9/0064 361/783 |
| 2013/0343024 A1* | 12/2013 | Hoshi | H05K 1/181 361/783 |
| 2014/0028412 A1* | 1/2014 | Sasaki | H03H 7/0138 333/12 |
| 2014/0091879 A1 | 4/2014 | Toyao et al. | |
| 2014/0152520 A1 | 6/2014 | Toyao et al. | |

FOREIGN PATENT DOCUMENTS

| | | |
|---|---|---|
| JP | 2008-131509 A | 6/2008 |
| JP | 2010-199881 A | 9/2010 |
| JP | 2011-249862 A | 12/2011 |
| JP | 2013-183082 A | 9/2013 |
| JP | 2013-232613 A | 11/2013 |
| WO | 2008/062562 A1 | 5/2008 |
| WO | 2009/082003 A1 | 7/2009 |

\* cited by examiner

PRINTED WIRING BOARD AND METHOD OF PRODUCING THE SAME

BACKGROUND OF THE INVENTION

1. Technical Field

The present invention relates to a printed wiring board that has an electromagnetic band gap (EBG) structure and a method of producing the printed wiring board.

2. Background

To artificially control the frequency dispersion of electromagnetic waves, structures in which conductor patches or other conductors are arrayed at regular spacings have been proposed. Among these structures, an electromagnetic band gap (referred to below as an "EBG") structure has been used for noise reductions, measures against interferences, and other similar purposes in a printed wiring board or a device package substrate. This EBG structure has an ability to reduce the propagation of electromagnetic waves in a specific frequency band. Examples of the EBG structure which have been proposed in the art include: a mushroom EBG structure having mushroom-shaped conductors; and a via-less EBG structure having no vias.

A typical multilayered printed wiring board is designed such that solid patterns having low impedance are formed on a power supply layer and a GND layer in order to stabilize an applied voltage and a supplied current. If both a digital circuit and an analog circuit are connected to the same power supply, not only DC components but also high-frequency AC components may be transmitted in typical solid patterns. In this case, high-frequency components generated in the digital circuit is prone to being transmitted to the analog circuit as noises. More specifically, the power supply layer and the GND layer have a resonance frequency depending on their shapes, and an electromagnetic wave whose frequency is the same as this resonance frequency becomes a standing wave. As a result, an electromagnetic wave with a specific frequency is transmitted exceptionally well. In short, a problem with multilayered printed wiring boards is that when a high-frequency noise generated in an IC or other digital circuit coincides with the resonance frequency, the operation of an analog circuit may be affected by this noise.

The following suggestions have been taken against the above noise problem.

Japanese Unexamined Patent Publication No. 2008-131509 proposes an EBG structural body for a printed wiring board, in which slits are formed in the power supply layer. This EBG structural body can be formed only with the power supply layer and thus requires no complex members, such as vias.

Japanese Unexamined Patent Publication No. 2010-199881 proposes a waveguide structure having an EBG structure, in which the spiral wires of open stub structures are connected to a GND plane through vias. In this EBG structure, a transmission line is connected to a stub wire through a via. Thus, the block frequency can be determined to be the resonance frequency at which the input impedance of the open stub becomes substantially zero. Since the resonance frequency can be controlled by the length of the stubs, the occupied area of the stubs can be decreased by forming the stub wires into a spiral shape. Therefore, this EBG structure is suitable for a compact design.

Japanese Unexamined Patent Publication No. 2013-183082 proposes a multilayered printed wiring board in which a power supply is divided into multiple pieces having a patch shape. An open stub is disposed in a part of each divided piece. By forming the EBG only with the power supply layer, the EBG structure is applicable easily to a compact design.

The report titled "Study for Planar EBG Structure with Ferrite Thin Film for Practice Use", which was written by Yoshitaka Toyota et al. at Okayama University and in Journal of 28th spring meeting in the Japan Institute of Electronics Packaging and was issued on Mar. 5, 2014, proposes noise measures using an EBG pattern with a meander line. By interconnecting patches (cells) with meander lines, the inductance of the EBG pattern can be increased. Thus, this EBG structure is intended for a compact design.

In the EBG structural body proposed in Japanese Unexamined Patent Publication No. 2008-131509, forming the slits in the solid pattern in the power supply layer is expected to reduce the transmission of high-frequency components. If the solid pattern is separated completely by the slit, the electricity cannot be supplied. Therefore, the solid patterns need to be partially continuous with power supply. To block noises in a 2.5 GHz band used for radio communication, for example, unit cells each having a size of about 16.5 mm per side are required. Unfortunately, such large-sized unit cells are not applicable easily to portable electric devices, such as notebook PCs.

The waveguide structure proposed in Japanese Unexamined Patent Publication No. 2010-199881 involves additionally forming a layer in which the open stub EBG structure is to be formed. Furthermore, since the wires of the open stubs are connected to the GND plane through the vias, a step dedicated to forming the vias needs to be added to the producing process of the printed wiring board. The addition of the dedicated step results in the increase in the number of steps, possibly pushing up an overall cost.

In the multilayered printed wiring board proposed in JP 2013-183082 A, the cells need to be interconnected by wide wires in order to supply a desired amount of current. If a large number of cells are used to widen the cutoff frequency band as in Example shown in FIG. 3, a complex current route may be created. In which case, the current consumption might be difficult to calculate.

In the report titled "Study for Planar EBG Structure with Ferrite Thin Film for Practice Use", which was written by Yoshitaka Toyota et al. at Okayama University and in Journal of 28th spring meeting in the Japan Institute of Electronics Packaging and was issued on Mar. 5, 2014, the cells are interconnected by the meander lines. Using the meander lines is expected to increase the inductance component and thus downsize unit cells. However, if a larger amount of current is supplied, wider meander lines need to be used, because the width of a meander line depends on its allowable current. According to Example, cells each having a size of about 7 mm per side are required to take the measures against noises in a 2.5 GHz band. Consequently, unit cells may be difficult to downsize.

SUMMARY

An object of the present invention is to provide a compact EBG structure that is disposed in a hybrid circuit including a digital circuit and an analog circuit and is capable of preventing high-frequency noises generated in digital and other circuits from flowing into the analog circuit or flowing out to external devices and thus causing an electromagnetic interference therewith. Another object of the present invention is to provide a printed wiring board in which the compact EBG structure is provided in its power supply layer.

Further another object of the present invention is to provide a method of producing the printed wiring board.

According to one embodiment of the present invention, a printed wiring board includes a digital circuit, an analog circuit, and a power supply path that is disposed on an insulating layer between the digital circuit and the analog circuit, a plurality of open stub EBG structures are disposed at an end of a bridge section in a power supply plane, and wherein the open stub EBG structure is an open stub state whose one end is connected to the power supply path and other end is in an open state.

According to one embodiment of the present invention, a method of producing a printed wiring board includes: disposing a power supply path on an insulating layer between a digital circuit and an analog circuit; forming an open stub EBG structure at an end of a bridge section in a power supply plane by disposing an open stub whose one end is connected to the power supply path and other end is in an open state; and forming a magnetic body film on an open stub EBG structure.

In a printed wiring board according to one embodiment of the present invention, open stub EBG structures are disposed in a part of a power supply plane. A necessary direct current can be supplied to an IC through a typical portion of the power supply plane. In addition, the resonance frequency of the open stub EBG structures depends on their stub length, and the open stub EBG structures have substantially zero input impedance for a current component whose frequency coincides with the resonance frequency. Therefore, by setting the stub length as appropriate, a desired high-frequency noise current can be cut off.

DETAILED DESCRIPTION

Figure 1:
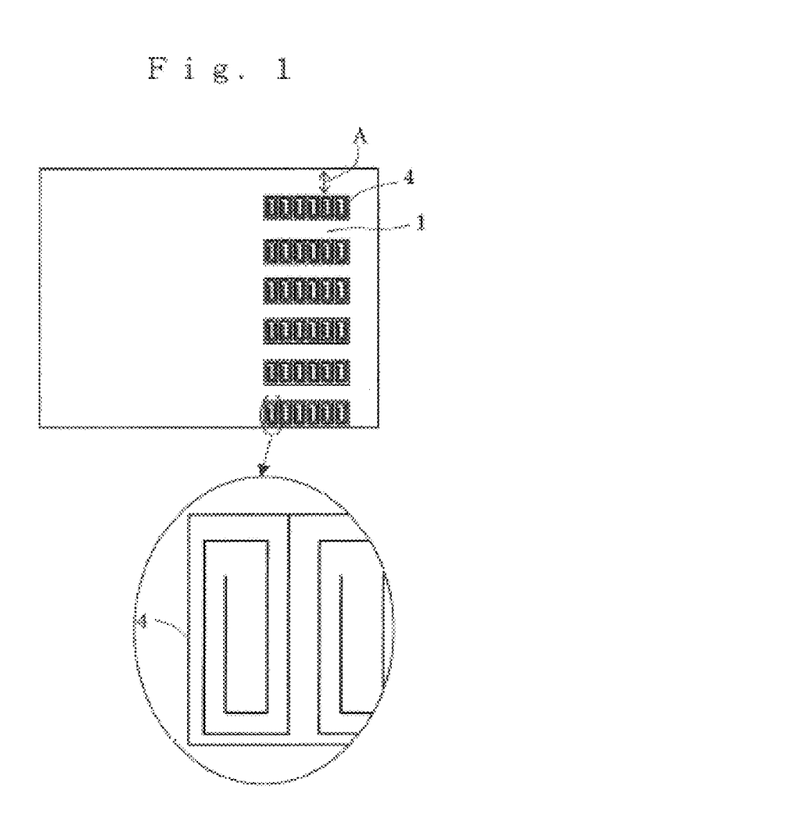
FIG. 1 illustrates a printed wiring board according to an embodiment of the present invention, and the open stub EBG structures in an enlarged manner.

A printed wiring board according to an embodiment of the present invention will be described with reference to the accompanying drawings. In the printed wiring board, a digital power supply block is connected to an analog power supply block through a power supply plane. As illustrated in FIG. 1, the power supply plane has a width A, which is set such that an amount of current required for an IC (semiconductor integrated circuit) can pass. The width A is preferably 2 to 6 mm, more preferably 3 to 4 mm. One or more bridge sections 1 may be formed.

Open stub EBG structures 4 are formed on a power supply solid pattern (power supply route) in the printed wiring board. As illustrated in the enlarged part of FIG. 1, each open stub EBG structure 4 is formed into a spiral shape with its open end positioned at the center. Its occupied area is preferably as small as possible. The spiral shape may include curved, linear, and angled parts. If the spiral shape includes angled parts, the wire of each open stub EBG structure 4 may be bent at arbitrary locations and an arbitrary number of times. The angle of the wire bent is not limited to a right angle. In addition, the wire may have round or chamfered corners, or may have a meander or spiral shape.

<Method of Disposing Open Stubs>

FIGS. 2A to 2D each illustrate open stub EBG structures disposed in the printed wiring board.

In FIGS. 2A to 2D, open stub EBG structures 4 are disposed adjacent to an analog circuit 3. Each open stub EBG structure 4 attenuates high-frequency noises that will enter the analog circuit 3. In the drawings, the arrows indicate the direction of a high-frequency noise current.

Figure 2A:
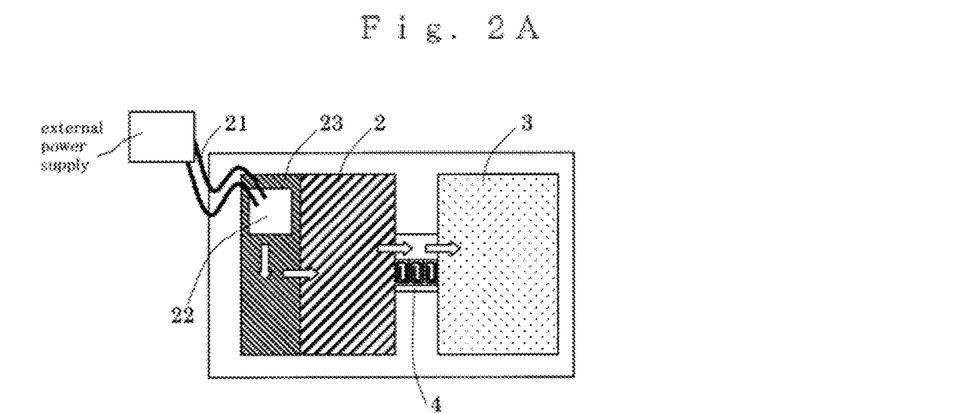
FIGS. 2A to 2D each illustrate the top surface of a power supply layer in a printed wiring board according to an embodiment of the present invention, in which open stub EBG structures are disposed.

Referring to FIG. 2A, a connector section 22 connected to an external power supply via an external power supply connection cable 21 (also shown in FIGS. 2B, 2C, 2D, 5A, 5B, 5C, 6A, 6B and 6C) is disposed inside a power supply circuit 23, and the open stub EBG structures 4 are disposed between a digital circuit 2 and the analog circuit 3. By disposing the open stub EBG structures 4 at a location where the analog circuit 3 is connected to another circuit, high-frequency noises that have been generated in the digital circuit 2, the power supply circuit 23, or an external power supply and will enter the analog circuit 3 are attenuated.

Figure 2B:
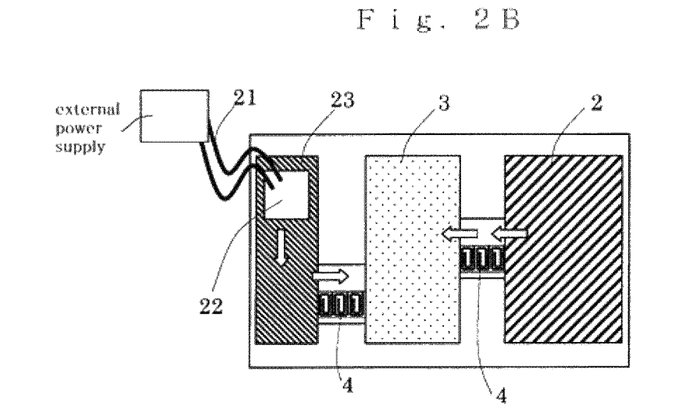

Referring to FIG. 2B, the connector section 22 is disposed inside the power supply circuit 23, and open stub EBG structures 4 are disposed between the power supply circuit 23 and the analog circuit 3 and between the analog circuit 3 and the digital circuit 2. By disposing the open stub EBG structures 4 at locations where the analog circuit 3 is connected to other circuits, high-frequency noises that have been generated in the digital circuit 2, the power supply circuit 23, or an external power supply and will enter the analog circuit 3 are attenuated.

Figure 2C:
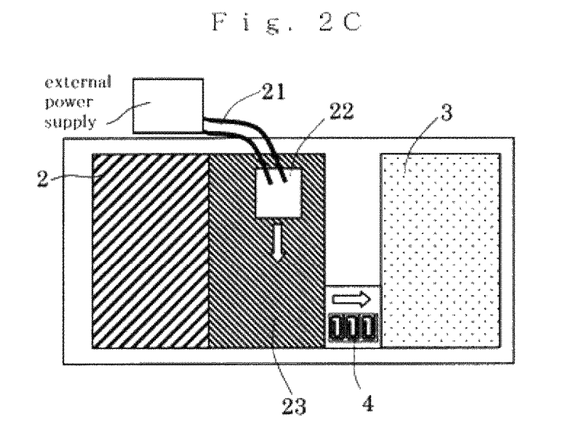

Referring to FIG. 2C, the connector section 22 is disposed inside the power supply circuit 23, and open stub EBG structures 4 are disposed between the power supply circuit 23 and the analog circuit 3. By disposing the open stub EBG structures 4 in this manner, high-frequency noises that have been generated in the digital circuit 2, the power supply circuit 23, or an external power supply and will enter the analog circuit 3 through the power supply circuit 23 are attenuated.

Figure 2D:
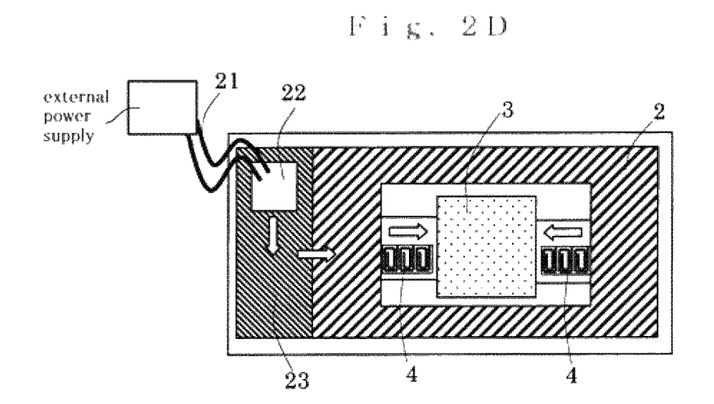

Referring to FIG. 2D, the connector section 22 is disposed inside the power supply circuit 23, and open stub EBG structures 4 are disposed between the digital circuit 2 and the analog circuit 3 disposed inside the digital circuit 2. By disposing the open stub EBG structures 4 in this manner, high-frequency noises that have been generated in the digital circuit 2, the power supply circuit 23, or an external power supply and will enter the analog circuit 3 are attenuated. If the digital circuit 2 is connected to the analog circuit 3 through a plurality of power supply paths, the open stub EBG structures 4 may be disposed in all the power supply paths connected to the analog circuit 3. Consequently, high-frequency noises that will enter the analog circuit 3 are attenuated.

Figure 3:
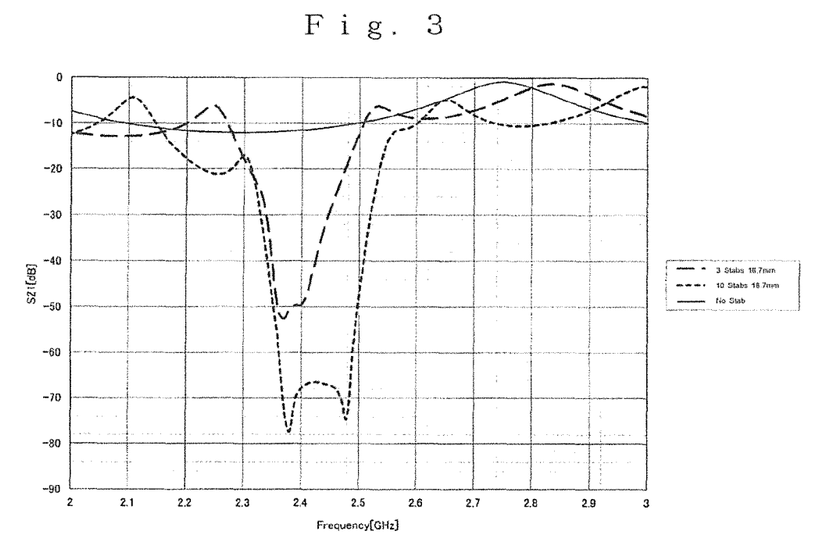
FIG. 3 is a graph analysis of the transmission losses when three, ten, and no open stub EBG structures are connected.

FIG. 3 is a graph analysis of the transmission losses when three and ten open stub EBG structures each having a wire length of 18.7 mm and no open stub EBG structures are connected between the right and left ends of a bridge section 1. Here, the transmission losses of the three and ten open stub EBG structures and no open stub EBG structures are denoted respectively by Stubs 18.7 mm 3 pcs, Stubs 18.7 mm 10 pcs, and No Stub.

FIG. 3 demonstrates that the connecting of open stub EBG structures can reduce the propagation of high-frequency electromagnetic waves. It can be found that the connecting of the ten open stub EBG structures reduces the propagation of high-frequency electromagnetic waves more than the connecting of the three open stub EBG structures. This means that the connecting of a larger number of open stub EBG structures can more reduce the propagation of high-frequency electromagnetic waves.

However, as the number of open stub EBG structures connected increases, its occupied area is increased. In light of the tradeoff between the reduction in the electromagnetic wave and the increase in the occupied area, about three open stub EBG structures, which can produce a minimal effect, are preferably connected.

Figure 4:
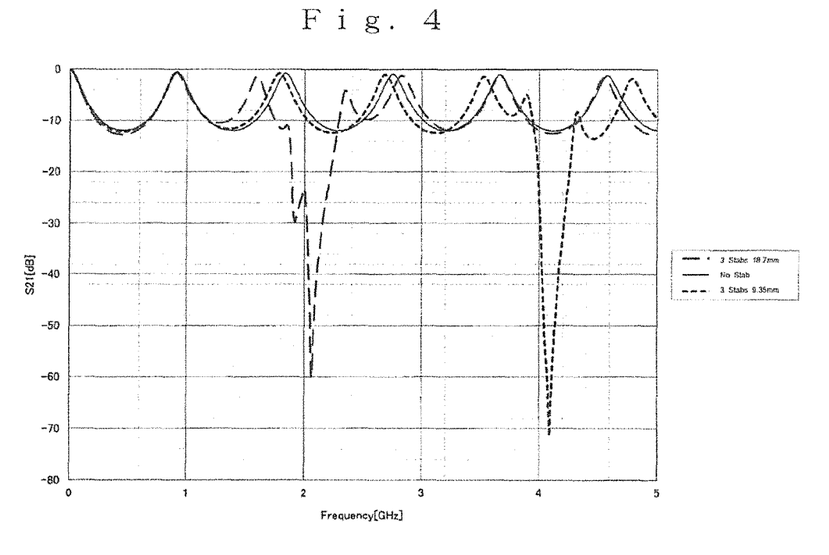
FIG. 4 is a graph analysis of the transmission losses when open stub EBG structures having wire lengths of 18.7 mm and 9.35 mm and no stub EBG structures are connected.

FIG. 4 is a graph analysis of the transmission losses when open stub EBG structures having different wire lengths, more specifically wire lengths of 18.7 mm and 9.35 mm are disposed on the bridge section 1. Here, the transmission losses of the open stub EBG structures having wire lengths of 18.7 mm and 9.35 mm are denoted respectively by Stubs 18.7 mm 3 pcs and Stubs 9.35 mm 3 pcs.

As can be found from FIG. 4, the cutoff frequency of an open stub depends on its wire length. Therefore, by preparing open stubs having different wire lengths, noises in multiple frequency bands can be attenuated. In this way, a multiband printed wiring board can be configured.

Suppose an insulating material between a power supply layer and a GND layer is made of FR-4; FR-4 is formed by impregnating glass fiber with epoxy resin. Assuming that an insulating interlayer thickness is 200 µm, a conducting layer thickness is 35 µm, and a target frequency is 2.4 GHz, the wire length of an open stub is set to typically 18.2 to 19.2 mm, more preferably 18.6 to 18.8 mm.

Next, a description will be given of other examples of disposing open stub EBG structures in a printed wiring board, with reference to FIGS. 5A to 6C.

This printed wiring board is connected to an external device through an external power supply connection cable 21 in a connector section 22. The connector section 22 is electrically connected to a digital circuit 2 or an analog circuit 3 through a power supply circuit 23; the power supply circuit 23 is commonly provided. The connector section 22 may be disposed inside the power supply circuit 23.

The digital circuit 2, the analog circuit 3, and open stub EBG structures 4 are identical to those having already been described and will not be described accordingly.

Figure 5A:
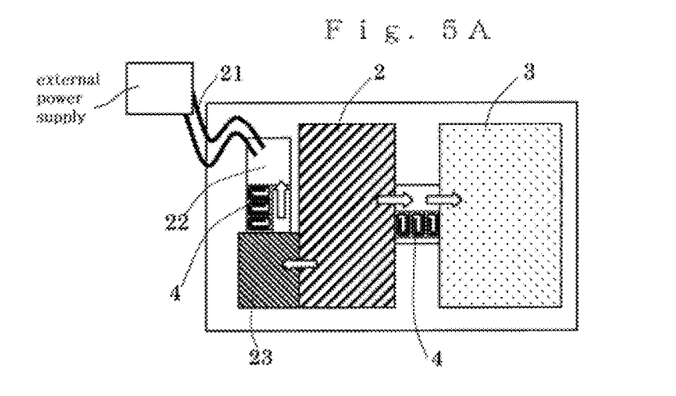
FIGS. 5A to 5C each illustrate the top surface in a printed wiring board according to an embodiment of the present invention, in which open stub EBG structures are disposed.

Referring to FIG. 5A, open stub EBG structures 4 are disposed between the connector section 22 and the power supply circuit 23.

By disposing the open stub EBG structures 4 in this manner, high-frequency noises that have been generated in the digital circuit 2 and will flow out to the external power supply connection cable 21 through the connector section 22 is attenuated. Thus, it can be expected that an electromagnetic interference with the external device is reduced.

Figure 5B:
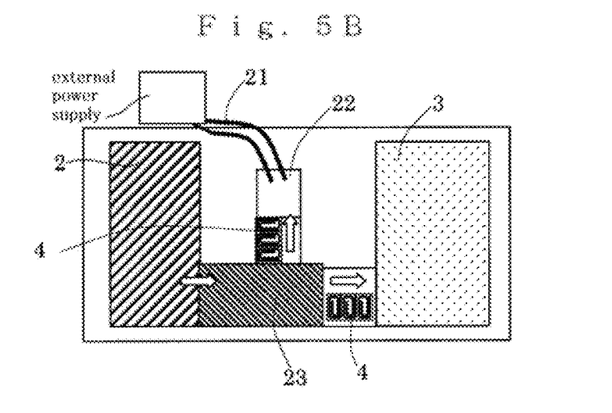

Referring to FIG. 5B, open stub EBG structures 4 are disposed between the power supply circuit 23 and the analog circuit 3 in order to prevent noises from entering the analog circuit 3. In addition, open stub EBG structures 4 are further disposed between the connector section 22 and the power supply circuit 23.

By disposing the open stub EBG structures 4 in this manner, high-frequency noises that have been generated in the digital circuit 2 and will flow out to the external power supply connection cable 21 through the connector section 22 is attenuated. Thus, it can be expected that an electromagnetic interference with the external device is reduced.

Figure 5C:
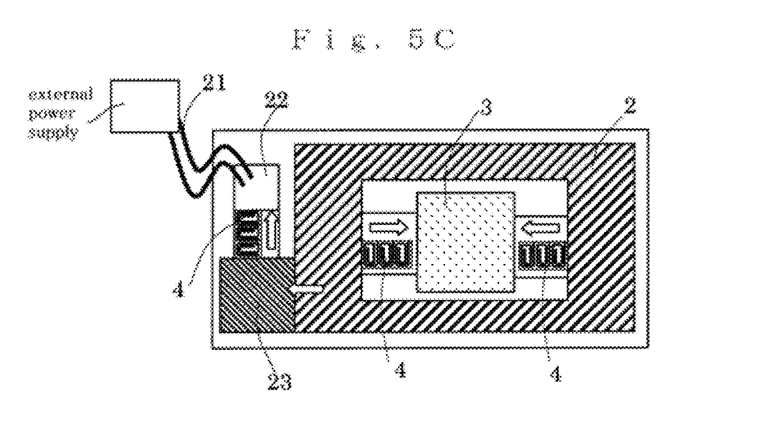

Referring to FIG. 5C, open stub EBG structures 4 are disposed between the digital circuit 2 and the analog circuit 3 disposed inside the digital circuit 2. Disposing the open stub EBG structures 4 aims to block noises generated in the digital circuit 2 from entering the analog circuit 3. High-frequency noises that have been generated in the digital circuit 2 and will flow out to the external power supply connection cable 21 through the connector section 22 is attenuated. Thus, it can be expected that an electromagnetic interference with the external device is reduced.

Figure 6A:
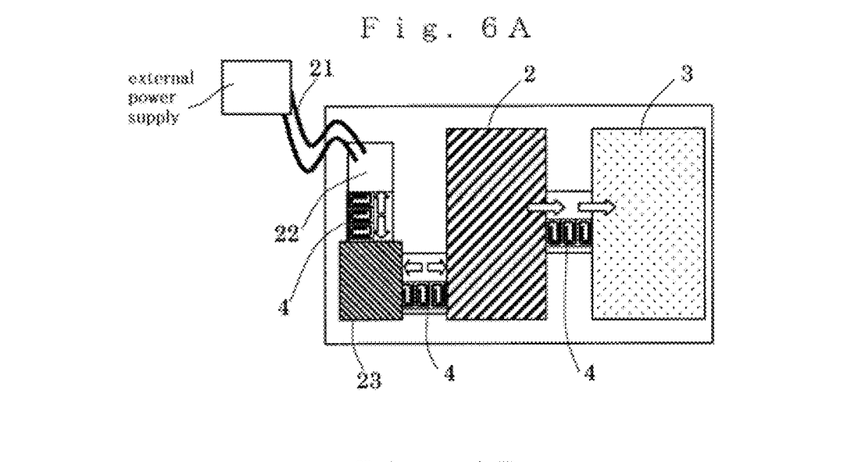
FIGS. 6A to 6C each illustrate the top surface in a printed wiring board according to an embodiment of the present invention, in which open stub EBG structures are disposed.

Referring to FIG. 6A, in addition to the circuitry in FIG. 5A, open stub EBG structures 4 are further disposed between the power supply circuit 23 and the digital circuit 2. This printed wiring board can reduce high-frequency noises flowing between the power supply circuit 23 and the digital circuit 2, unlike the printed wiring board illustrated in FIG. 5A.

Figure 6B:
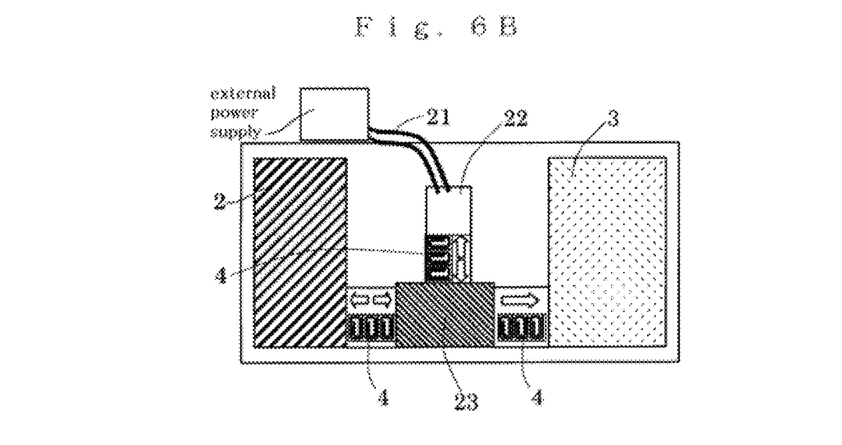

Referring to FIG. 6B, in addition to the circuitry in FIG. 5B, open stub EBG structures 4 are further disposed between the power supply circuit 23 and the digital circuit 2. This printed wiring board can reduce high-frequency noises flowing between the power supply circuit 23 and the digital circuit 2, unlike the printed wiring board illustrated in FIG. 5B.

Figure 6C:
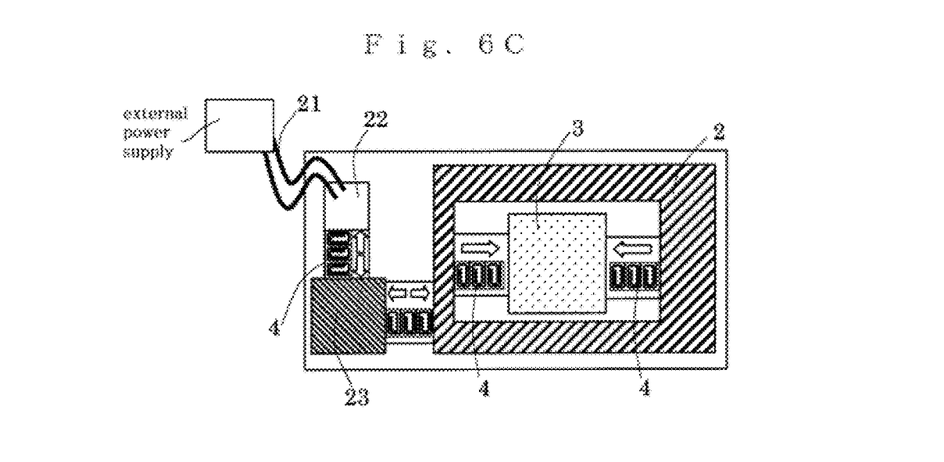

Referring to FIG. 6C, in addition to the circuitry in FIG. 5C, open stub EBG structures 4 are further disposed between the power supply circuit 23 and the digital circuit 2. This printed wiring board can reduce high-frequency noises flowing between the power supply circuit 23 and the digital circuit 2, unlike the printed wiring board illustrated in FIG. 5C.

<Structure of Combination with Magnetic Body>

In a printed wiring board according to an embodiment of the present invention, a magnetic body is disposed so as to contact the wire of each open stub with a predetermined coating or film forming method, for example. The conductivity and permeability of this magnetic body produce a wavelength shortening effect, namely, allows for a compact design. If a parallel plate type magnetic body is used, the block band of an open stub EBG structure which would be narrow is widened, because the imaginary part of the complex permeability of the magnetic body produces a loss effect. Each of the magnetic bodies may be made up of a single composition, and all the magnetic bodies may have the same thickness.

A magnetic body used in an embodiment of the present invention preferably contains a high complex permeability composition. A reason is that as the complex permeability composition of a magnetic body increases, the volume of the magnetic body which is required to widen a block band decreases. Moreover, a magnetic body preferably has a high surface resistivity, more specifically at least $10^2$ Ω/sq. A reason is that a magnetic body having a higher surface resistivity is less likely to cause disadvantages, such as the fluctuations of constants of circuits mounted around the magnetic body.

A magnetic body used in an embodiment of the present invention may be disposed so as to contact an open stub wire with a coating or film forming method or may be disposed close to an open stub wire, for example with an adhesive layer therebetween. Examples of a magnetic body used in an embodiment of the present invention include: a soft magnetic, thin film such as a thin ferrite plating film; a magnetic paste formed by dispersing the soft magnetic powder of a metal, a ferrite, or other material in a resin or other medium; and a ferrite sintered body. Among these, a thin ferrite plating film is most preferable.

A thin ferrite plating film is created by forming, on a substrate, a spinel ferrite material with the formula $MFe_2O_4$ where M represents metal elements, including Ni, Zn, Co, Mn, and Fe. In ferrite plating, an aqueous solution that contains metal ions, including $Ni^{2+}$, $Zn^{2+}$, $Co^{2+}$, $Mn^{2+}$, and $Fe^{2+}$, is brought into contact with the surface of the substrate, and the substrate thereby absorbs the metal ions. Then, $Fe^{2+}$ ion is oxidized with an oxidizer, for example ($Fe^{2+} \rightarrow Fe^{3+}$). The metal ions react with hydroxide metal ions in the aqueous solution to create a ferrite crystal. As a result, the thin ferrite plating film is formed on the surface of the substrate. The ferrite plating is electroless plating using an aqueous solution process and enables a film to be formed directly on a resin film or a printed wiring board, for example. Therefore, with the ferrite plating, a film that exhibits both a relatively high surface resistivity and good magnetic characteristics can be formed without the use of a thermal treatment. A thin ferrite plating film can keep a higher permeability in a high frequency band than a ferrite bulk or a complex made up of a magnetic powder and a resin. The frequency characteristics of permeability depend on the composition used therein. Therefore, the composition of a thin ferrite plating film may be selected on the basis of a frequency at which a standing wave is generated. An exemplary composition of a thin ferrite plating film is $Ni_{0.0\ to\ 0.4}Zn_{0.0\ to\ 0.5}Co_{0.0\ to\ 0.4}Mn_{0.0\ to\ 0.4}Fe_{2.0\ to\ 2.8}O_4$ (at least one of the metal elements Ni, Zn, Co, and Mn is not 0). This thin ferrite plating film can exhibit good high-frequency permeability characteristics and a high surface resistivity. A thin ferrite plating film having a larger thickness can have a wider block band. However, to ensure a wide block band and a firm adhesion to a main body, the thickness of a thin ferrite plating film is preferably in the range from 0.2 to 20 μm.

Next, a description will be given of a method of producing a printed wiring board coated with a magnetic body. This producing method includes steps (i) to (vi) that will be described below.

(i) A core board in which a power supply layer and a conducting layer are formed on the respective surfaces of an insulating plate is formed.
(ii) A magnetic body is applied over an area of EBG structures disposed on the power supply layer that has been formed on the surface of the core board.
(iii) A clearance is created in the part of the magnetic body in which a through-hole is to be formed so as to pass through the power supply layer.
(iv) An insulating resin layer is stacked on a surface of the core board, and then another core board is stacked on an insulating resin layer.
(v) A through-hole pilot hole is formed across the core boards and the insulating resin layer with a laser or drill process.
(vi) The inner surface of the through-hole pilot hole is coated with a plating layer.

A description will be given of a method of producing a printed wiring board according to an embodiment of the present invention, with reference to FIGS. 7A to 7F.

Figure 7A:
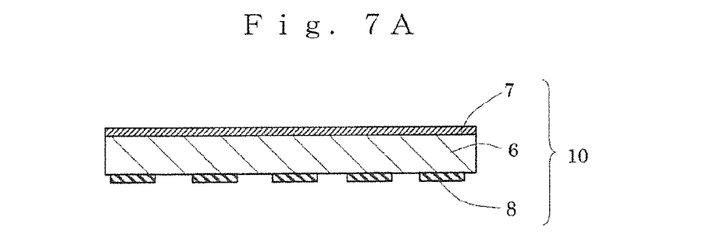
FIGS. 7A to 7F illustrate the cross section of a printed wiring board according to an embodiment of the present invention at individual producing process steps.

Referring to FIG. 7A, a core board 10 has a structure in which a power supply layer 7 and a wire pattern 8 are formed on the respective surfaces of an insulating board 6.

The insulating board 6 may be made of any given insulating material. Examples of the insulating material include an epoxy resin, a bismaleimide triazine resin, a polyimide resin, a polyphenylene ether (PPE) resin, and any other organic resins. Two or more of such organic resins may be used in combination. If an organic resin is used for the insulating board 6, this organic resin preferably contains a reinforcing material. Examples of the reinforcing material include a glass fiber, a nonwoven grass fabric, a nonwoven aramid fabric, an aramid fiber, and a polyester fiber. Two or more of such reinforcing materials may be used in combination. The insulating board 6 is preferably made of organic resin containing a glass material such as a glass fiber. The insulating board 6 may contain an inorganic filler, such as silica, barium sulfate, talc, clay, glass, calcium carbonate, and titanium oxide. The insulating board 6 may have any thickness, although the thickness is preferably 0.02 to 10 mm.

EBG structures are formed in the power supply layer 7, and magnetic bodies are disposed between the power supply layer and the GND layer, whereby the inductance of the EBG structures is increased. If a penetrating through-hole is required, a magnetic body in which the through-hole would be formed is removed or no magnetic body is disposed in an area where the through-hole is to be formed.

To form the wire pattern 8, a photosensitive resist (e.g., a dry-film etching resist) is bonded to the insulating board 6 with roll laminating. Then, the photosensitive resist is exposed to light and developed, and a part of the photosensitive resist other than a circuit pattern is exposed. The exposed copper part is removed with etching. The etching liquid may be aqueous ferric chloride. The dry-film etching resist is peeled off, whereby the wire pattern 8 is formed. In this way, the core board 10 in which the wire pattern 8 is formed on the surface of the insulating board 6 is formed.

Figure 7B:
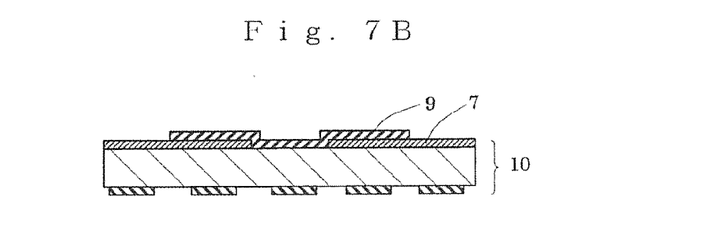

Following the above, as illustrated in FIG. 7B, the regions of the power supply layer 7 in which the EBG structures (open stubs) have been formed are partially removed, and a magnetic body film 9 is applied. The magnetic body film 9 is preferably a thin ferrite plating film, as described above, having a thickness of 0.2 to 20 μm.

Figure 7C:
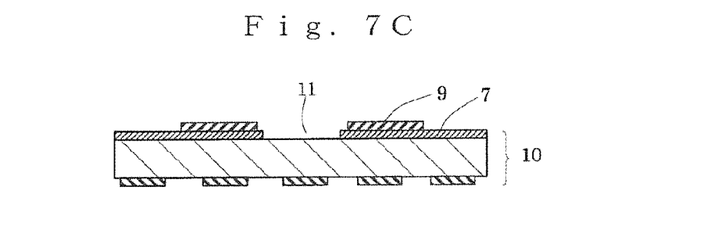

Following the above, as illustrated in FIG. 7C, a clearance 11 is created in the part of the magnetic body film 9 which the through-hole is to be formed across the power supply layer 7. Creating the clearance 11 can minimize the elution of the magnetic body film 9 which would be caused by a copper plating liquid or a desmear liquid.

Figure 7D:
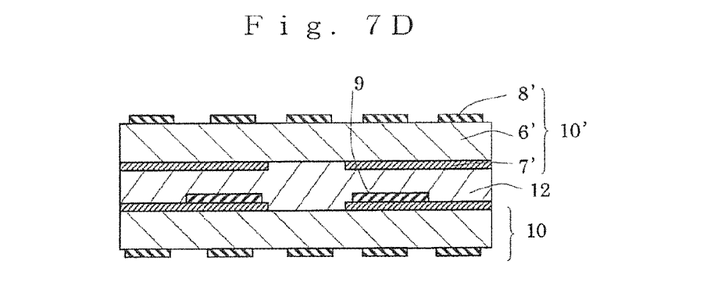

Following the above, as illustrated in FIG. 7D, an insulating resin layer 12 is stacked on the magnetic body film 9. Then, a core board 10', which has substantially the same configuration as the core board 10, is stacked on the insulating resin layer 12 with a wire pattern 8' facing outward.

To form the insulating resin layer 12, a prepreg is interposed between the core boards 10 and 10', and the core boards 10 and 10' are thermally compressed with a laminating press so that the prepreg is melted and cured.

Figure 7E:
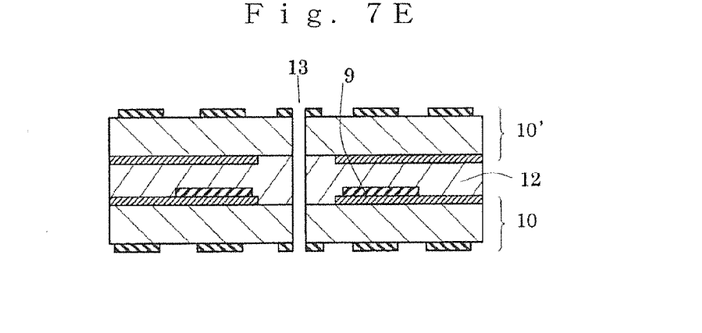

Following the above, as illustrated in FIG. 7E, a through-hole pilot hole 13 is formed with a drill or laser, for example, so as to pass through the wire pattern 8', the insulating resin layer 12, the wire pattern 8, and the like.

After the through-hole pilot hole 13 has been formed, there are cases where a thin resin film is left on the inner surface of the through-hole pilot hole 13 and other surfaces. In this case, a desmear process is preferably performed. In the desmear process, the resin is swollen with a strongly-alkaline solution, and then decomposed and removed with an oxidizer (e.g., chromic acid or a permanganate solution). Alternatively, the resin may be removed through a wet blasting process using an abrasive or a plasma process.

Figure 7F:
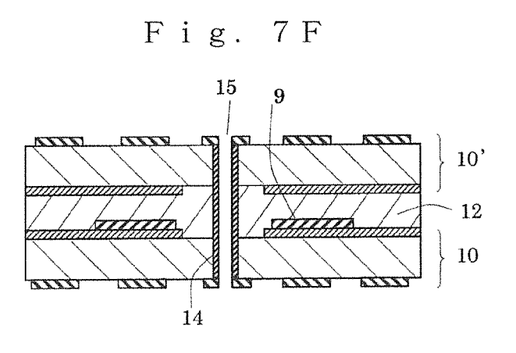

Following the above, as illustrated in FIG. 7F, the inner surface of the through-hole pilot hole 13 is coated with a plated layer 14, whereby a through-hole 15 is formed. The plated layer 14 is preferably formed with electroless or electrolytic copper plating. The electrolytic copper plating is preferred especially when a thick plated layer 14 is formed. The electrolytic copper plating makes it possible to form a plated layer 14 having a thickness of about 1 to 30 µm, for example. Through the through-hole 15, the wire patterns 8 and 8' disposed with the core board 10 therebetween are electrically interconnected and the power supply layer 7 in the core board 10 and the power supply layer 7' in the core board 10' are electrically interconnected.

Optionally, solder resists may be formed on the surfaces of the core boards 10 and 10' at predetermined locations. To form the solder resists, photosensitive liquid solder resists are applied to the surfaces of the core boards 10 and 10' with spray coating, roll coating, curtain coating, or screen printing, for example, so that the photosensitive liquid solder resists each having a thickness of about 10 to 80 µm are formed. Then, the photosensitive liquid solder resists are dried. Alternatively, photosensitive-dry-film solder resists are bonded with roll laminating. Subsequently, the solder resists are exposed to light and developed whereby pad and other parts are opened. Then, the solder resists are thermally cured. After that, the exteriors of the core boards 10 and 10' and the like are processed. Through the above processing, a printed wiring board according to an embodiment of the present invention is produced.

In the above description, a printed wiring board according to an embodiment of the present invention is exemplified by a typical multilayered printed wiring board. However, a printed wiring board according to an embodiment is not limited to a multilayered printed wiring board, and can be implemented using a build-up or other type of multilayered printed wiring board.

As described above, open stub EBG structures are disposed in a part of a power supply plane, and a necessary direct current is supplied to an IC through a typical part of the power supply plane. When a high-frequency noise current flows through the open stub EBG structures, the high-frequency noise current is greatly attenuated at a resonant frequency determined by the length of the stubs. As a result, the high-frequency noise current is substantially cut off. If a digital circuit and an analog circuit share a power supply plane in a hybrid board, when electricity is supplied to the analog circuit through a bridge section in which open stubs are disposed, high-frequency noises generated in the digital circuit hardly propagate along the bridge section but a necessary DC component is supplied to the analog circuit.

If a plurality of digital circuit blocks are mounted, a slit may be formed in the digital circuit blocks so that an analog circuit is surrounded by the digital circuit blocks. In addition, open stubs may be disposed at an end of a bridge section. In this way, measures against noise can be taken.

The cutoff frequency of an open stub depends on its wire length.

By forming the wire of an open stub into a spiral shape, the area occupied by the open stub can be decreased.

By arraying a plurality of open stubs having the same wire length, the attenuation factor can be enhanced.

By combining open stubs that have different wire lengths, noises generated from radio communications using different frequencies can be attenuated simultaneously. This is because multiple cutoff frequencies can be set by adjusting the wire lengths differently.

A printed wiring board as described above is connected to an external device through an external power supply connection cable in a connector section. In this case, open stub EBG structures may be disposed in the vicinity of the connector section. These open stub EBG structures attenuate high-frequency noises that will flow out to the external device, reducing an electromagnetic interference with the external device.

An EBG structure according to an embodiment of the present invention is exemplified by a planar EBG structure having no vias. In a typical planar EBG structure having no vias, the noise block frequency depends on a patch size. Therefore, to set the noise block frequency to a desired one, patches may be unable to be downsized easily and thus cells may be enlarged. On the other hand, in an EBG structure using an open stub, the noise block frequency can be set to the resonance frequency of the open stub, but a via is necessary. In contrast, the structure according to the embodiment of the present invention enables an open stub to be disposed without the forming of vias. Thus, this structure can both reduce the risk of pushing up the cost of a board, more specifically the risk of increasing the number of layers and achieve a compact design.

To supply a necessary amount of current is supplied to an IC through a stub, the width of the stub wire may be restricted. In the structure according to the embodiment of the present invention, however, a stub wire having an open end which does not allow high-frequency noises to transmit therethrough is disposed separately from a supply route of a direct current. Therefore, the width of the stub wire is not restricted. Specifically, a direct current is supplied to a typical solid part of a power supply layer, and an open stub whose wire length is determined from its cutoff frequency is connected to another part adjoining to the typical solid part. This structure can reduce the propagation of noises.

The present invention is not limited to the embodiment described above and can be modified and varied in various ways within the scope of the claims.

What is claimed is:

1. A printed wiring board comprising:
   a digital circuit;
   an analog circuit;
   a power supply path disposed on an insulating layer between the digital circuit and the analog circuit; and
   a plurality of open stub electromagnetic band gap structures disposed on the insulating layer, on which the power supply path is disposed, at an end of a bridge section in a power supply plane,
   wherein each of the plurality of open stub electromagnetic band gap structures comprises one end connected to the power supply path, and another end in an open state, and
   wherein each of the plurality of open stub electromagnetic band gap structures does not have a via connected to another layer.

2. The printed wiring board according to claim 1, wherein the analog circuit is relatively smaller than the digital circuit, and
   a slit is formed between the analog circuit and the power supply path to electrically insulate the analog circuit from the power supply path, and a slit is formed between the open stub electromagnetic band gap structures and a peripheral circuit to electrically insulate the open stub electromagnetic band gap structures from the peripheral circuit.

3. The printed wiring board according to claim 1, wherein the plurality of the open stub electromagnetic band gap structures are disposed on the insulating layer around the analog circuit so as to surround the analog circuit.

4. The printed wiring board according to claim 1, wherein the plurality of the open stub electromagnetic band gap structures are disposed on the insulating layer adjacent to the power supply path.

5. The printed wiring board according to claim 1, further comprising:
   a connector section connected to an external power supply; and
   a power supply circuit electrically connecting the connector section to the digital circuit or the analog circuit,
   wherein the plurality of open stub electromagnetic band gap structures are disposed on the insulating layer in the vicinity of the connector section.

6. The printed wiring board according to claim 1, wherein a plurality of the open stub electromagnetic band gap structures have a different length in accordance with a corresponding cutoff frequency.

7. The printed wiring board according to claim 1, wherein a magnetic body film is formed in an area of the open stub electromagnetic band gap structures.

8. The printed wiring board according to claim 7, wherein the magnetic body film has a thickness of 0.2 to 20 μm.

9. The printed wiring board according to claim 1, wherein each open stub electromagnetic band gap structure has a spiral shape, and the other end of each open stub electromagnetic band gap structure in the open state is positioned at the center of the spiral shape or adjacent to the center of the spiral shape.

10. The printed wiring board according to claim 7, wherein the magnetic body film is a thin ferrite plating film.

11. The printed wiring board according to claim 7, wherein the magnetic body film is formed on an open stub electromagnetic band gap.

12. The printed wiring board according to claim 5, wherein the plurality of the open stub electromagnetic band gap structures are disposed on the insulating layer between the power supply circuit and the digital circuit.

13. A method of producing a printed wiring board comprising:
    forming a power supply path disposed on an insulating layer between a digital circuit and an analog circuit;
    forming a plurality of open stub electromagnetic band gap structures on the insulating layer, on which the power supply path is disposed, at an end of a bridge section in a power supply plane by disposing an open stub comprising one end connected to the power supply path and another end in an open state; and
    forming a magnetic body film on the open stub electromagnetic band gap structure,
    wherein each of the plurality of open stub electromagnetic band gap structures do not have a via connected to another layer.

* * * * *